(12) United States Patent
Lu et al.

(10) Patent No.: US 12,549,199 B2
(45) Date of Patent: Feb. 10, 2026

(54) DATA CONVERSION APPARATUS, ELECTRONIC DEVICE AND DATA CONVERSION METHOD

(71) Applicant: BOE TECHNOLOGY GROUP CO., LTD., Beijing (CN)

(72) Inventors: Zhipeng Lu, Beijing (CN); Xichao Fan, Beijing (CN); Feng Qu, Beijing (CN); Yazhou Ren, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 155 days.

(21) Appl. No.: 18/695,742

(22) PCT Filed: Jan. 17, 2023

(86) PCT No.: PCT/CN2023/072702
§ 371 (c)(1),
(2) Date: Mar. 26, 2024

(87) PCT Pub. No.: WO2024/152208
PCT Pub. Date: Jul. 25, 2024

(65) Prior Publication Data
US 2025/0132770 A1    Apr. 24, 2025

(51) Int. Cl.
*H03M 9/00* (2006.01)
(52) U.S. Cl.
CPC ...................... *H03M 9/00* (2013.01)
(58) Field of Classification Search
CPC ............ H03M 9/00; H03M 7/00; H03M 7/20; H03M 7/22
USPC ..................... 341/50, 100, 101, 102
See application file for complete search history.

(56) References Cited

U.S. PATENT DOCUMENTS 7,253,754 B2 *   8/2007   Takeuchi ................ H03M 9/00
                                                    341/100
8,396,215 B2     3/2013   Yamashita

FOREIGN PATENT DOCUMENTS

| CN | 103364714 A | 10/2013 |
| CN | 105680871 A | 6/2016 |
| CN | 106201945 A | 12/2016 |
| CN | 109002409 A | 12/2018 |
| CN | 110515879 A | 11/2019 |

(Continued)

OTHER PUBLICATIONS

ISR and WO re: PCT/CN2023/072702. English-language Translation.

*Primary Examiner* — Peguy Jean Pierre
(74) *Attorney, Agent, or Firm* — The Webb Law Firm

(57) ABSTRACT

A data conversion apparatus includes a conversion module, a frequency divider module electrically connected to the conversion module, and a clock selection module electrically connected to both the conversion module and the frequency divider module. The frequency divider module is configured to divide an input clock signal to obtain an output clock signal according to a bit-width m of input data and a bit-width n of output data. The clock selection module is configured to transmit the input clock signal and the output clock signal to the conversion module as a write clock signal and a read clock signal, respectively. The conversion module is configured to: receive the input data of m-bit-width according to the write clock signal; convert the input data into the output data of n-bit-width; and output the output data according to the read clock signal.

20 Claims, 8 Drawing Sheets

(56) References Cited

FOREIGN PATENT DOCUMENTS

CN 114649011 A 6/2022

\* cited by examiner

DATA CONVERSION APPARATUS, ELECTRONIC DEVICE AND DATA CONVERSION METHOD

CROSS-REFERENCE TO RELATED APPLICATION

This application is the United States national phase of International Patent Application No. PCT/CN2023/072702, filed Jan. 17, 2023, the disclosure of which is hereby incorporated by reference in its entirety.

BACKGROUND OF THE INVENTION

Field of the Invention

The present disclosure relates to the field of display technology, and in particular, to a data conversion apparatus, an electronic device, and a data conversion method.

Description of Related Art

In the existing field programmable gate array (FPGA) technology, in order to achieve serial transmission of data, parallel data in the circuit is generally converted into serial data for transmission, and then at the end of the transmission, the serial data is reconverted into the parallel data. In order to achieve parallel-to-serial and serial-to-parallel conversion of data, it is necessary to first put the data into the shift register for caching, and finally an output signal is generated by the counter to output the data.

SUMMARY OF THE INVENTION

In an aspect, a data conversion apparatus is provided. The data conversion apparatus includes a conversion module, a frequency divider module and a clock selection module. The frequency divider module is electrically connected to the conversion module, and the clock selection module is electrically connected to both the conversion module and the frequency divider module. The conversion module is configured to convert received input data of m-bit-width into output data of n-bit-width. A bit width conversion ratio of the input data and the output data is R, m and n are positive integers, and m≠n. The frequency divider module is configured to divide the input clock signal according to a bit-width m of the input data and a bit-width n of the output data to obtain an output clock signal.

The clock selection module is configured to transmit the input clock signal and the output clock signal to the conversion module as a write clock signal and a read clock signal of the conversion module, respectively, according to the input clock signal, the output clock signal, the bit-width m of the input data and the bit-width n of the output data. The conversion module is further configured to: receive the input data of m-bit-width according to the write clock signal; and output the output data according to the read clock signal. In a case where the bit-width m of the input data is greater than the bit-width n of the output data, the input clock signal is used as the read clock signal of the conversion module, and the output clock signal is used as the write clock signal of the conversion module. In a case where the bit-width m of the input data is less than the bit-width n of the output data, the input clock signal is used as the write clock signal of the conversion module, and the output clock signal is used as the read clock signal of the conversion module.

In some embodiments, the data conversion apparatus further includes a data transmission port, a clock signal port and a reset signal port. The data transmission port is electrically connected to the conversion module. The data transmission port includes a data input port and a data output port. The data input port is configured to receive the input data of m-bit-width, and the data output port is configured to output the output data of n-bit-width. The clock signal port includes a clock signal input port and a clock signal output port. The clock signal input port is electrically connected to an input clock port of the frequency divider module, and the clock signal output port is electrically connected to an output clock port of the frequency divider module.

The reset signal port is electrically connected to both the frequency divider module and the conversion module. The frequency divider module is configured to reset the input clock signal and the output clock signal under control of the reset signal port. The conversion module is configured to be reset under control of the reset signal port.

In some embodiments, the data conversion apparatus further includes a first signal port and a second signal port. The first signal port includes a first input port and a first output port. The first input port is configured to receive a first input signal, and the first output port is configured to output a first output signal. States of the first input signal and the first output signal each include a first state or a second state. The second signal port includes a second input port and a second output port. The second input port is configured to receive a second input signal. The second output port is configured to output a second output signal. States of the second input signal and the second output signal each include a first state or a second state.

In some embodiments, in a case where the states of the first input signal received by the first input port and the second input signal received by the second input port are both the first state, the data input port is configured to receive the input data of m-bit-width. In a case where the states of the first input signal received by the first input port and the second input signal received by the second input port are both the second state, or in a case where the state of any one of the first input signal received by the first input port and the second input signal received by the second input port is the first state, and the state of another of the first input signal received by the first input port and the second input signal received by the second input port is the second state, the data input port is configured to receive no input data of m-bit-width.

In a case where the states of the first output signal output by the first output port and the second output signal output by the second output port are both the first state, the data output port is configured to output the output data of n-bit-width. In a case where the states of the first output signal output by the first output port and the second output signal output by the second output port are both the second state, or in a case where the state of any one of the first output signal output by the first output port and the second output signal output by the second output port is the first state, and the state of another of the first output signal output by the first output port and the second output signal output by the second output port is the second state, the data output port is configured to output no output data of n-bit-width.

In some embodiments, the frequency divider module includes a frequency divider; the frequency divider includes a first pin, a second pin and a reset pin; the first pin of the frequency divider is electrically connected to the clock signal input port, the second pin of the frequency divider is electrically connected to the clock signal output port, and the reset pin of the frequency divider is electrically connected to the reset signal port. The frequency divider is configured to divide the input clock signal to obtain the output clock signal according to the bit-width m of the input data and the bit-width n of the output data; and the frequency divider is further configured to reset the input clock signal and the output clock signal under the control of the reset signal port.

In some embodiments, the conversion module includes a shift register; the shift register is configured to convert the received input data of m-bit-width into the output data of n-bit-width. The clock selection module includes a first clock selector. The first clock selector includes a first input pin, a second input pin and a write clock output pin. The first input pin of the first clock selector is electrically connected to the first pin of the frequency divider, and the second input pin of the first clock selector is electrically connected to the second pin of the frequency divider.

The first clock selector is configured to: receive the input clock signal and the output clock signal transmitted by the frequency divider; and transmit the received input clock signal or output clock signal to the shift register as a write clock signal according to the bit-width m of the input data and the bit-width n of the output data.

In some embodiments, the shift register includes a data input pin, a data output pin and a write clock input pin.

In a case where the bit-width m of the input data is greater than the bit-width n of the output data, the output clock signal is used as a write clock signal of the shift register. In a case where the bit-width m of the input data is less than the bit-width n of the output data, the input clock signal is used as the write clock signal of the shift register.

The data input pin of the shift register is electrically connected to the data input port, the data output pin of the shift register is electrically connected to the data output port, and the write clock pin of the shift register is electrically connected to the write clock output pin of the first clock selector. The shift register is configured to control an input rate of the input data according to the write clock signal transmitted by the first clock selector.

In some embodiments, the first clock selector further includes a read clock output pin. The first clock selector is further configured to transmit the received input clock signal or output clock signal to the shift register as a read clock signal according to the bit-width m of the input data and the bit-width n of the output data. The shift register further includes a read clock input pin. The read clock input pin of the shift register is electrically connected to the read clock output pin of the first clock selector. The shift register is further configured to control an output rate of the output data according to the read clock signal transmitted by the first clock selector.

In a case where the bit-width m of the input data is greater than the bit-width n of the output data, the input clock signal is used as a read clock signal of the shift register. In a case where the bit-width m of the input data is less than the bit-width n of the output data, the output clock signal is used as the read clock signal of the shift register.

In some embodiments, the clock selection module further includes a second clock selector. The second clock selector includes a first input pin, a second input pin and a read clock output pin.

The first input pin of the second clock selector is electrically connected to the first pin of the frequency divider, the second input pin of the second clock selector is electrically connected to the second pin of the frequency divider, and the read clock output pin of the second clock selector is electrically connected to the read clock input pin of the shift register. The second clock selector is configured to: receive the input clock signal and the output clock signal transmitted by the frequency divider; and transmit the received input clock signal or the output clock signal to the shift register as a read clock signal according to the bit-width m of the input data and the bit-width n of the output data. The shift register is configured to control an output rate of the output data according to the read clock signal input by the second clock selector.

In some embodiments, the conversion module further includes a first-in first-out memory. The first-in-first-out memory includes a data input pin, a data output pin, a write clock input pin, a read clock input pin, an input ready pin, an output ready pin, an input data valid pin, an output data valid pin and a reset pin.

The reset pin of the first-in-first-out memory is electrically connected to the reset signal port. The first-in-first-out memory is configured to be reset under the control of the reset signal port. The data conversion apparatus further includes a second signal port including a second input port and a second output port. The second input port is electrically connected to the input ready pin of the first-in-first-out memory, and the output ready pin of the first-in-first-out memory is electrically connected to the second output port.

In some embodiments, the data conversion apparatus further includes a first signal port including a first input port and a first output port. The shift register further includes an input data valid pin and an output data valid pin. The data output pin of the shift register is electrically connected to the data input pin of the first-in-first-out memory, and the data output pin of the first-in-first-out memory is electrically connected to the data output port. The first input port is electrically connected to the input data valid pin of the shift register, the output data valid pin of the shift register is electrically connected to the input data valid pin of the first-in-first-out memory, and the output data valid pin of the first-in first-out memory is electrically connected to the first output port.

In some embodiments, the first clock selector further includes a read clock output pin. The read clock output pin of the first clock selector is electrically connected to both the write clock input pin and the read clock input pin of the first-in-first-out memory. A read clock output by the read clock output pin of the first clock selector is used as a read clock and a write clock of the first-in-first-out memory.

In some embodiments, the clock selection module further includes a second clock selector. The second clock selector includes a first input pin, a second input pin and a read clock output pin. The first input pin of the second clock selector is electrically connected to the first pin of the frequency divider, and the second input pin of the second clock selector is electrically connected to the second pin of the frequency divider, and the read clock output pin of the second clock selector is electrically connected to both the read clock input pin and the write clock input pin of the first-in-first-out memory.

The second clock selector is configured to: receive the input clock signal and the output clock signal transmitted by the frequency divider; take the received input clock signal or the output clock signal as a read clock signal according to the bit-width m of the input data and the bit-width n of the output data; and transmit the read clock signal to both the write clock input pin and the read clock input pin of the first-in-first-out memory.

In some embodiments, the first-in-first-out memory is configured to: control a writing rate of the output data according to a write clock input by the second clock selector;

and control a reading rate of the output data according to a read clock input by the second clock selector.

In some embodiments, the data conversion apparatus further includes a write feedback port and a read feedback port. The first-in-first-out memory further includes a write feedback pin and a read feedback pin. The write feedback pin of the first-in-first-out memory is electrically connected to the write feedback port, and the read feedback pin of the first-in-first-out memory is electrically connected to the read feedback port.

The write feedback port is configured to control a data writing rate of the shift register to the first-in-first-out memory according to a write feedback signal transmitted by the write feedback pin. The read feedback port is configured to control a data reading rate of the first-in-first-out memory according to a read feedback signal transmitted by the read feedback pin.

In some embodiments, a storage capacity of the first-in-first-out memory is D, and D≥5N. In a case where the bit-width m of the input data is greater than the bit-width n of the output data, N=m; in a case where the bit-width m of the input data is less than the bit-width n of the output data, N=n.

In some embodiments, a state of the write feedback signal includes a first state or a second state; in a case where the state of the write feedback signal is the second state, the write feedback port is configured to control the shift register to write data to the first-in-first-out memory; in a case where the state of the write feedback signal is the first state, the write feedback port is configured to control the shift register to suspend writing data to the first-in-first-out memory.

A state of the read feedback signal includes a first state or a second state; in a case where the state of the read feedback signal is the second state, the read feedback port is configured to control data stored in the first-in-first-out memory to be read; in a case where the state of the read feedback signal is the first state, the read feedback port is configured to control the data stored in the first-in-first-out memory to not be read.

In some embodiments, a stored capacity of the first-in-first-out memory is P. In a case where P is greater than or equal to D−N, the state of the write feedback signal is the first state. In a case where P is less than or equal to N, the state of the read feedback signal is the first state.

In another aspect, an electronic device is provided. The electronic device includes the data conversion apparatus provided according to the above embodiment.

In yet another aspect, a data transmission method is provided. The data transmission method includes following steps:
- obtain a bit-width m of an input data and a bit-width n of an output data; wherein m and n are positive integers, and m≠n;
- divide, by a frequency divider module, an input clock signal to obtain an output clock signal according to the bit-width m of the input data and the bit-width n of the output data; and transmit, by the frequency divider module, the input clock signal and the output clock signal to a clock selection module;
- transmit, by the clock selection module, the input clock signal and the output clock to a conversion module as a write clock signal and a read clock signal of the conversion module, respectively, according to the input clock signal, the output clock signal, the bit-width m of the input data and the bit-width n of the output data; wherein in a case where the bit-width m of the input data is greater than the bit-width n of the output data, the input clock signal is used as the read clock signal of the conversion module, and the output clock signal is used as the write clock signal of the conversion module; and in a case where the bit-width m of the input data is less than the bit-width n of the output data, the input clock signal is used as the write clock signal of the conversion module, and the output clock signal is used as the read clock signal of the conversion module;
- receive, by the conversion module, the input data of m-bit-width according to the write clock signal; convert, by the conversion module, the input data of m-bit-width into the output data of n-bit-width; and output, by the conversion module, the output data of n-bit-width according to the read clock signal.

BRIEF DESCRIPTION OF THE DRAWINGS

In order to describe technical solutions in the present disclosure more clearly, the accompanying drawings to be used in some embodiments of the present disclosure will be introduced briefly; obviously, the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

DESCRIPTION OF THE INVENTION

Figure 1:
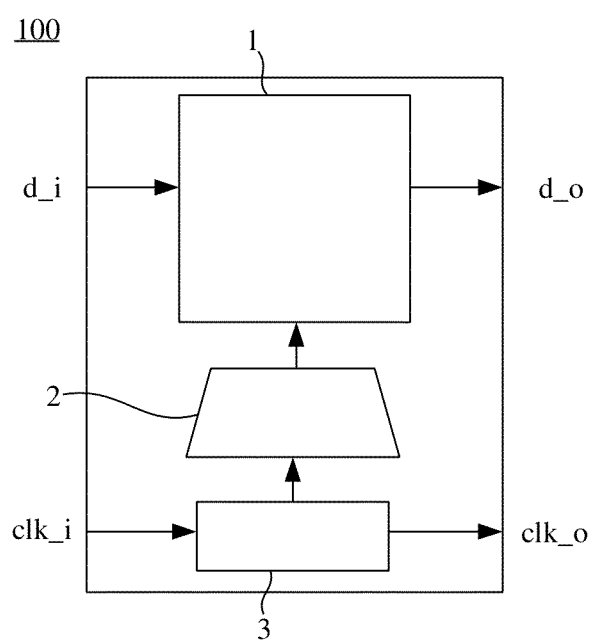
FIG. 1 is a structural diagram of a data conversion apparatus, in accordance with some embodiments.

The technical solutions in some embodiments of the present disclosure will be described clearly and completely with reference to the accompanying drawings. Obviously, the described embodiments are merely some but not all of embodiments of the present disclosure. All other embodiments obtained on the basis of the embodiments of the present disclosure by a person of ordinary skill in the art shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials, or characteristics described herein may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

Some embodiments may be described using the terms "coupled", "connected" and their derivatives. The term "connected" should be understood in a broad sense; for example, "connected" may be a fixed connection, a detachable connection, or an integrated connection; "connected" may be directly connected or indirectly connected through an intermediate medium. The term "coupled" indicates, for example, that two or more components are in direct physical or electrical contact. The term "coupled" or "communicatively coupled" may indicate that two or more components are not in direct contact with each other, but still cooperate or interact with each other. The embodiments disclosed herein are not necessarily limited to the context herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of "applicable to" or "configured to" herein means an open and inclusive expression, which does not exclude devices that are applicable to or configured to perform additional tasks or steps.

Additionally, the use of the phrase "based on" is meant to be open and inclusive, since a process, step, calculation or other action that is "based on" one or more of the stated conditions or values may, in practice, be based on additional conditions or value beyond those stated.

As used herein, the term such as "about", "substantially" or "approximately" includes a stated value and an average value within an acceptable range of deviation of a particular value, and the acceptable range of deviation is determined by a person of ordinary skill in the art in view of the measurement in question and errors associated with measurement of a particular quantity (i.e., the limitation of the measurement system).

Exemplary embodiments are described herein with reference to segmental views and/or plan views as idealized exemplary drawings. In the accompanying drawings, thicknesses of layers and sizes of regions (areas) are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

In some FPGA designs, a control signal not only controls the switching of clock frequency, but is also responsible for the shifting of the data shift register, buffering of data, counting control of output, and the like, which will increase the complexity of the control signal. The control signal in FPGA is composed of a combinational circuit, and in a high-frequency clock system, burrs and misoperation may occur in the control signal. Moreover, a ratio of the input clock to the output clock in serial-to-parallel conversion and parallel-to-serial conversion is fixed. In a case of encountering data delay, the design of the control signal will be more complicated, and the presence of clock offset in the input clock and the output clock may lead to errors for the data conversion.

Based on this, some embodiments of the present disclosure provide a data conversion apparatus 100, an electronic device 1000, and a data conversion method to overcome the above problems. The data conversion apparatus 100 provided in some embodiments of the present disclosure will be described below.

In some embodiments, as shown in FIG. 1, the data conversion apparatus 100 includes a conversion module 1, a frequency divider module 3 and a clock selection module 2. The frequency divider module 3 is electrically connected to the conversion module 1. The clock selection module 2 is electrically connected to both the conversion module 1 and the frequency divider module 3.

The conversion module 1 is configured to convert received input data of m-bit-width into output data of n-bit-width. A bit width conversion ratio of the input data and the output data is R. m and n are all positive integers, and m≠n. The frequency divider module 3 is configured to divide an input clock signal clk_i according to the bit-width m of the input data and the bit-width n of the output data to obtain an output clock signal clk_o.

The clock selection module 2 is configured to transmit a write clock signal clk_w and a read clock signal clk_r to the conversion module 1 according to the input clock signal clk_i, the output clock signal clk_o, and the bit-width m of the input data and the bit-width n of the output data.

A frequency of the input clock signal clk_i is $f_{clk\_i}$, a frequency of the output clock signal clk_o is $f_{clk\_o}$, a frequency of the write clock signal clk_w is $f_w$, and a frequency of the read clock signal clk_r is $f_r$. There is a relationship between a bit width conversion ratio R of the input data and the output data and the bit-width m of the input data, the bit-width n of the output data, the frequency $f_{clk\_i}$ of the input clock signal clk_i, the frequency $f_{clk\_o}$ of the output clock signal clk_o, the frequency $f_w$ of the write clock signal clk_w and the frequency $f_r$ of the read clock signal clk_r.

In a case where the bit-width m of the input data is greater than the bit-width n of the output data, the input clock signal clk_i serves as the read clock signal clk_r of the conversion module 1, and the output clock signal clk_o serves as the write clock signal clk_w of the conversion module 1, $$R = \frac{m}{n} = \frac{f_{clk\_i}}{f_{clk\_o}} = \frac{f_r}{f_w}.$$

In a case where the bit-width m of the input data is less than the bit-width n of the output data, the input clock signal clk_i serves as the write clock signal clk_w of the conversion module 1, and the output clock signal clk_o serves as the read clock signal clk_r of the conversion module 1, $$R = \frac{n}{m} = \frac{f_{clk\_i}}{f_{clk\_o}} = \frac{f_w}{f_r}.$$

The data conversion apparatus 100 provided by some embodiments of the present disclosure is able to perform different execution programs (data serial/parallel conversion execution programs or data parallel/serial conversion execution programs) according to requirements, thereby achieving the conversion of bit-width of data, such as the conversion of serial data into parallel data, or the conversion of parallel data into serial data. Compared with a conversion manner of the fixed-bit-width, the bit-width of the input data and the bit-width of the output data may be flexibly set, so that the usage is flexible, and there are more application scenarios.

The data conversion apparatus 100 is referred to as a current-stage circuit, the m-bit input data is transmitted from a previous-stage circuit to the current-stage circuit, and the conversion of the bit-width of data (the conversion of the data of low-bit-width into the data of high-bit-width, or the conversion of the data of high-bit-width into the data of low-bit-width) is performed in the current-stage circuit; for example, it is possible to achieve the conversion of parallel data into serial data or the conversion of serial data into parallel data; and then the converted data is transmitted to a next-stage circuit.

When performing the execution programs, the data conversion apparatus 100 sends a control signal to the conversion module 1 according to the bit-width m of the input data and the bit-width n of the output data. The conversion module 1 converts the bit-width of the data (for example, converting serial data into parallel data, or converting parallel data into serial data) according to the received control signal. It is possible to achieve the conversion of serial data into parallel data, or achieve the conversion of parallel data to serial data through a device, thereby achieving the conversion of the bit-width of data (e.g., the conversion of parallel data into serial data, or the conversion of serial data into parallel data) in the former circuit, and achieving the transmission of the converted data to the next-stage circuit.

By the frequency divider module 3, the input clock is divided according to the bit-width m of the input data and the bit-width n of the output data to obtain the output clock, and the input clock and the output clock obtained by dividing the input clock are all output to the clock selection module 2. It will be understood that a period of the output clock is greater than a period of the input clock. Compared with the input clock, the output clock is a slow clock, and correspondingly, the input clock is a fast clock.

Moreover, the output clock and the input clock obtained in this way are in-phase clocks, which may ensure the integrity and correctness of data under high-speed continuous data transmission, so as to avoid data transmission errors due to the asynchronous input clock and output clock.

In a case where the bit-width m of the input data is greater than the bit-width n of the output data, the data conversion apparatus 100 converts data of high-bit-width into data of low-bit-width, for example, converts parallel data into serial data. The input clock signal clk_i serves as the read clock signal clk_r of the conversion module 1, and the output clock signal clk_o serves as the write clock signal clk_w of the conversion module 1. In this case, a period of the write clock of the conversion module 1 is greater than a period of the read clock of the conversion module 1, and a rate at which the conversion module 1 writes the input data is less than a rate at which the conversion module 1 reads the output data.

In a case where the bit-width m of the input data is less than the bit-width n of the output data, the data conversion apparatus 100 converts the data of low-bit-width into the data of high-bit-width, for example, converts serial data into parallel data; the input clock signal clk_i serves as the write clock signal clk_w of the conversion module 1, the output clock signal clk_o serves as the read clock signal clk_r of the conversion module 1. In this case, a period of the write clock of the conversion module 1 is less than a period of the read clock of the conversion module 1, and a rate at which the conversion module 1 writes the input data is greater than a rate at which the conversion module 1 reads the output data.

The clock selection module 2 transmits different write clock signal clk_w and read clock signal clk_r to the conversion module 1 according to the bit-width m of the input data and the bit-width n of the output data, so that the clock of the data conversion apparatus 100 is adjustable; moreover, the conversion module 1 has different write clock and read clock, that is, the data conversion apparatus 100 has different write clock and read clock, so that the data conversion apparatus 100 matches the data transmission rate that adapts thereto according to the bit-width of data, so as to ensure the data conversion and the data transmission rate of the data conversion apparatus 100.

Figure 2:
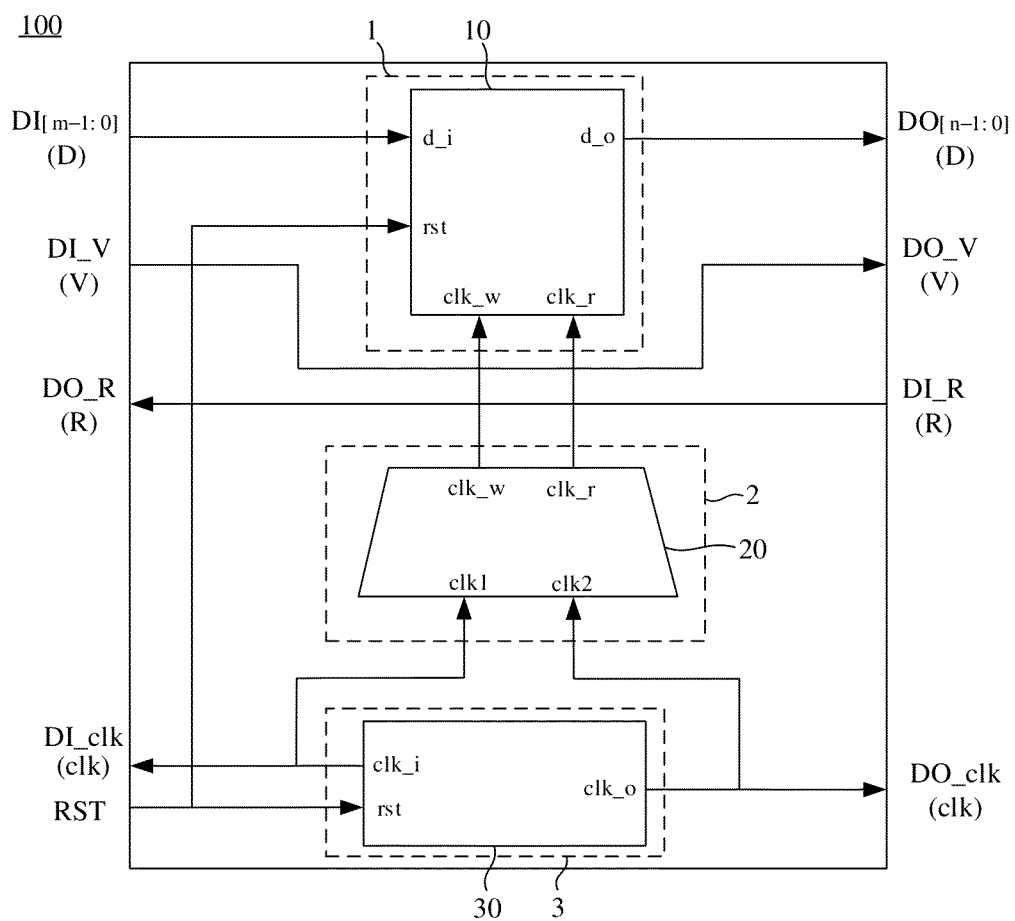
FIG. 2 is a structural diagram of another data conversion apparatus, in accordance with some embodiments.

In some embodiments, as shown in FIG. 2, the data conversion apparatus 100 further includes a data transmission port D, a clock signal port clk, a first signal port V, a second signal port R, and a reset signal port RST.

As shown in FIG. 2, the data transmission port D includes a data input port DI and a data output port DO. The data input port DI is configured to receive the input data of m-bit-width, and the data output port DO is configured to output the output data of n-bit-width.

As shown in FIG. 2, the clock signal port clk includes a clock signal input port DI_clk and a clock signal output port DO_clk. The clock signal input port DI_clk is electrically connected to an input clock pin clk_i of the frequency divider module 3, and the clock signal output port DO_clk is electrically connected to an output clock port clk_o of the frequency divider module 3.

As shown in FIG. 2, the first signal port V includes a first input port DI_V and a first output port DO_V. The first input port DI_V is configured to receive a first input signal, and the first output port DO_V is configured to output a first output signal. The states of the first input signal and the first output signal each include a first state or a second state.

As shown in FIG. 2, the second signal port R includes a second input port DI_R and a second output port DO_R. The second input port DI_R is configured to receive a second input signal. The second output port DO_R is configured to output a second output signal. The states of the second input signal and the second output signal each include a first state or a second state.

In a case where the states of the first input signal received by the first input port DI_V and the second input signal received by the second input port DI_R are both the first state, the data input port DI receives the input data of m-bit-width. In a case where the states of the first input signal received by the first input port DI_V and the second input signal received by the second input port DI_R are both the second state, or in a case where the state of any one of the first input signal received by the first input port DI_V and the second input signal received by the second input port DI_R is the first state, and the state of the other of the first input signal received by the first input port DI_V and the second input signal received by the second input port DI_R is the second state, the data input port DI does not receive the input data of m-bit-width.

In a case where the states of the first output signal output by the first output port DO_V and the second output signal output by the second output port DO_R are both the first state, the data output port DO outputs the output data of n-bit-width. In a case where the states of the first output signal output by the first output port DO_V and the second output signal output by the second output port DO_R are both the second state, or in a case where the state of any one of the first output signal output by the first output port DO_V and the second output signal output by the second output port DO_R is the first state, and the state of the other of the first output signal output by the first output port DO_V and the second output signal output by the second output port DO_R is the second state, the data output port DO does not output the output data of n-bit-width.

The reset signal port RST is electrically connected to both the frequency divider module 3 and the conversion module 1. The frequency divider module 3 is configured to reset the input clock signal clk_i and the output clock signal clk_o under control of the reset signal port RST. The conversion module 1 is configured to be reset under control of the reset signal port RST.

For example, while resetting the frequency divider module 3, the reset signal port RST also resets the clock signal input port DI_clk and the clock signal output port DO_clk.

For example, as shown in FIG. 2, the first signal port V is, for example, a transmission port for transmitting a data valid signal Data_Valid. The data conversion apparatus 100 obtains the first input signal and/or the first output signal transmitted by the first signal port V to determine whether the data transmitted by data transmission port D is valid.

In some examples, the first input port DI_V is, for example, a transmission port for an input data valid signal DataIn_Valid. The data conversion apparatus 100 obtains the signal (e.g., the first input signal) input by the first input port DI_V to determine whether the input data input by the data input port DI is valid. In a case where the state of the first input signal is the first state, the input data input by the data input port DI is valid data. In a case where the state of the first input signal is the second state, the input data input by the data input port DI is invalid data.

In a case where the state of the first input signal is the first state, the first input signal maintains in the first level; in a case where the state of the first input signal is the second state, the first input signal maintains in the second level. The first level is, for example, higher than the second level.

In some other examples, the first output port DO_V is, for example, a transmission port for an output data valid signal DataOutn_Valid of a data output port DO. The data conversion apparatus 100 obtains the signal (e.g., the first output signal) output by the first output port DO_V to determine whether the output data output by the data output port DO is valid. In a case where the state of the first output signal is the first state, the output data output by the data output port DO is valid data. In a case where the state of the first output signal is the second state, the output data output by the data output port DO is invalid data.

In a case where the state of the first output signal is the first state, the first output signal maintains in the first level; in a case where the state of the first output signal is the second state, the first output signal maintains in the second level. The first level is, for example, higher than the second level.

It will be noted that the above is only an example of a possible implementation of the first signal port V, which is not intended to be limited in the present disclosure.

For example, as shown in FIG. 2, the second signal port R is used as, for example, a transmission port for transmitting a data ready signal Data_Ready. The data conversion apparatus 100 obtains the second input signal and/or the second output signal transmitted by the second signal port R to determine whether the data transmitted by data transmission port D is ready.

In some examples, the second input port DI_R is, for example, a transmission port for an input data ready signal DataIn_Ready. The data conversion apparatus 100 obtains the signal (e.g., the second input signal) input by the second input port DI_R to determine whether the data input port DI allows data to be input. In a case where the state of the second input signal is the first state, the data input port DI allows data to be input. In a case where the state of the second input signal is the second state, the data input port DI does not allow data to be input.

In a case where the state of the second input signal is the first state, the second input signal maintains in the first level; in a case where the state of the second input signal is the second state, the second input signal maintains in the second level. The first level is, for example, higher than the second level.

In some other examples, the second output port DO_R is, for example, a transmission port for an output data ready signal DataOut_Ready. The data conversion apparatus 100 obtains the signal (e.g., the second output signal) output by the second output port DO_R to determine whether the data output port DO allows data to be output. In a case where the state of the second output signal is the first state, the data output port DO allows data to be output. In a case where the state of the second output signal is the second state, the data output port DO does not allow data to be output.

In a case where the state of the second output signal is the first state, the second output signal maintains in the first level; in a case where the state of the second output signal is the second state, the second output signal maintains in the second level. The first level is, for example, higher than the second level.

It will be noted that the above is only an example of a possible implementation of the second signal port R, which is not intended to be limited in the present disclosure.

The data conversion apparatus 100 provided in some embodiments of the present disclosure determines the validity of the input data input by the data input port DI by obtaining the first input signal input by the first input port DI_V, and determines whether the data input port DI allows to receive data by obtaining the second input signal input by the second input port DI_R. The data conversion apparatus 100 allows data to be input by the data input port DI only if the data input port DI allows to receive data and the input data input by the data input port DI is valid.

In a case of either the data input port DI does not allow to receive data or the input data input by the data input port DI is invalid, the data conversion apparatus 100 does not allow data to be input by the data input port DI. Thus, it is possible to ensure the validity and correctness of the input data to avoid data transmission errors. Moreover, it is possible to adjust the data input rate of the data input port DI to achieve discontinuous data transmission.

The data conversion apparatus 100 provided in some embodiments of the present disclosure determines the validity of the output data output by the data output port DO by obtaining the first output signal output by the first output port DO_V, and determines whether the data output port DO allows to output data by obtaining the second output signal output by the second output port DO_R. The data conversion apparatus 100 allows data to be output by the data output port DO only if the data output port DO allows to output data and the output data output by the data output port DO is valid.

In a case of either the data output port DO does not allow to output data or the output data output by the data output port DO is invalid, the data conversion apparatus 100 does not allow data to be output by the data output port DO. Thus, it is possible to ensure the validity and correctness of the output data to avoid data transmission errors. Moreover, it is possible to adjust the data output rate of the data output port DO to achieve discontinuous data transmission.

In summary, in the data conversion apparatus 100 provided by some embodiments of the present disclosure, the conversion of the data bit-width (e.g., conversion of parallel data to serial data, or conversion of serial data to parallel data) is achieved by transmitting the m-bit input data input by the data input port DI to the conversion module 1, and then the converted n-bit output data is output by the data output port DO. In this process, the validity of the input data and the output data is monitored by obtaining the signals (the first input/output signal, and/or the second input/output signal) of the first signal port V and the second signal port R; in a case where the validity of the data does not meet the set requirements, data transmission is stopped to avoid data transmission errors.

It will be understood that in a case where the input data includes valid data (data that requires conversion from serial data to parallel data or conversion from parallel data to serial data) and additional information data (data that does not require conversion from serial data to parallel data or conversion from parallel data to serial data), the validity of the input data and the output data is monitored by obtaining the signals (the first input/output signal, and/or the second input/output signal) of the first signal port V and the second signal port R, so that the additional information data in the input data may be separated and removed from the input data. Thus, only the valid data in the input data is transmitted to the conversion module for the conversion of data bit-width (conversion of parallel data to serial data, or conversion of serial data to parallel data), and the additional information data included in the input data is not transmitted to the conversion module, which removes invalid information and invalid data and reduces unnecessary data transmission, so that the data transmission efficiency is further improved.

By setting the reset signal port RST, after the conversion module 1 completes the conversion of parallel data to serial data or the conversion of serial data to parallel data once, a reset signal is send to the conversion module 1; after receiving the reset signal, the conversion module 1 clears the cached data and restores to the initial state, thereby avoiding the problem of data transmission errors caused by data crossover during multiple data conversion processes.

Moreover, due to the provision of the reset signal port RST, in a case where there is a data conversion error in the process that the conversion module 1 converts parallel data to serial data or converts serial data to parallel data, the reset signal is send to the conversion module 1 by the reset signal port RST; after receiving the reset signal, the conversion module 1 clears the cached data and restores to the initial state, and re-converts the erroneous data, thereby avoiding the problem of data transmission anomalies caused by data conversion errors.

In some examples, in a case where the data conversion apparatus 100 executes different operating procedures, the bit-width m of the input data and the bit-width n of the output data change. It will be understood that, the input clock and the output clock that are transmitted by the frequency divider module 3 to the conversion module 1 change accordingly. By setting the reset signal port RST, when the bit-width m of the input data and the bit-width n of the output data change, the frequency divider module 3 is reset to restore to the initial state according to the received reset signal, divides the input clock according to the width m of the input data and the bit-width n of the output data to obtain the output clock, and outputs the input data and the output data that match the bit-width m of the current input data and the bit-width n of the current output data to the conversion module 1. Thus, it is ensured that the clock signal transmitted from the frequency divider module 3 to the conversion module 1 matches the bit-width m of the current input data and the bit-width n of the current output data, thereby avoiding the problem of abnormal data transmission due to the mismatch between the clock signal and the data bit-width.

In some embodiments, as shown in FIG. 2, the frequency divider module 3 includes a frequency divider 30. The frequency divider 30 includes a first pin clk_i, a second pin clk_o and a reset pin rst. The clock selection module 2 includes a first clock selector 20. The first clock selector 20 includes a first input pin clk1, a second input pin clk2 and a write clock output pin clk_w. The conversion module 1 includes a shift register 10. The shift register 10 is configured to convert the received input data of m-bit-width into the output data of n-bit-width. The shift register 10 includes a data input pin d_i, a data output pin d_o and a write clock input pin clk_w.

The first pin clk_i of the frequency divider 30 is electrically connected to the clock signal input port DI_clk, the second pin clk_o of the frequency divider 30 is electrically connected to the clock output port, and the reset pin rst of the frequency divider 30 is electrically connected to the reset signal port RST. The frequency divider 30 is configured to divide the input clock signal clk_i according to the bit-width m of the input data and the bit-width n of the output data to obtain the output clock signal clk_o. The frequency divider 30 is further configured to reset the input clock signal clk_i and the output clock signal clk_o under control of the reset signal port RST.

The first input pin clk1 of the first clock selector 20 is electrically connected to the first pin clk_i of the frequency divider 30, and the second input pin clk2 of the first clock selector 20 is electrically connected to the second pin clk_o of the frequency divider 30. The first clock selector 20 is configured to: receive the input clock signal clk_i and the output clock signal clk_o transmitted by the frequency divider 30, and transmit the received input clock signal clk_i or output clock signal clk_o to the shift register 10 as the write clock signal clk_w according to the bit-width m of the input data and the bit-width n of the output data.

In a case where the bit-width m of the input data is greater than the bit-width n of the output data, the output clock signal clk_o serves as the write clock signal clk_w of the shift register 10. In a case where the bit-width m of the input data is less than the bit-width n of the output data, the input clock signal clk_i serves as the write clock signal clk_w of the shift register 10.

The data input pin d_i of the shift register 10 is electrically connected to the data input port DI, the data output pin d_o of the shift register 10 is electrically connected to the data output port DO, and the write clock pin of the shift register 10 is electrically connected to the write clock output pin clk_w of the first clock selector 20. The shift register 10 is configured to control the input rate of the input data according to the write clock signal clk_w transmitted by the first clock selector 20.

For example, the shift register 10 writes the input data of m-bit-width according to the write clock signal clk_w, and converts the input data of m-bit-width into the output data of n-bit-width.

Referring to FIG. 2, in the data conversion apparatus 100, the data input port DI of the data conversion apparatus 100 is electrically connected to the data input pin d_i of the shift register 10, and the data output port DO of the data conversion apparatus 100 is electrically connected to the data input pin d_i of the shift register 10. The shift register 10 writes the m-bit input data for buffering according to the write clock corresponding to the write clock signal clk_w transmitted by the clock selection module 2, and converts the received m-bit input data into the n-bit output data. Then, the shift register 10 also controls the output rate of the n-bit output data according to the read clock corresponding to the read clock signal clk_r transmitted by the clock selection module 2.

Referring to FIG. 2, in the data conversion apparatus 100, the clock signal input port DI_clk of the data conversion apparatus 100 is electrically connected to the first pin clk_i of the frequency divider 30, and the clock signal output port DO_clk of the data conversion apparatus 100 is electrically connected to the second pin clk_o of the frequency divider 30, thereby transmitting the input clock signal and the output clock signal to the former circuit and the latter circuit respectively through the frequency divider 30.

The reset pin rst of the frequency divider 30 is electrically connected to the reset signal port RST to achieve the reset of the frequency divider 30. In a case where it is necessary to reset the frequency divider 30, the data conversion apparatus 100 sends a reset signal to the frequency divider 30, so that the frequency divider 30 resets the input clock signal clk_i and the output clock signal clk_o under the control of the reset signal port RST.

The input clock is divided by the frequency divider 30 to obtain the output clock signal that is different from the input clock signal. The clock selection module 2 respectively selects the corresponding clock signals according to the bit-width m of the input data and the bit-width n of the output data and transmits the corresponding clock signals to the conversion module 1, and the conversion module 1 receives different read clock signal and write clock signal, that is, the conversion module 1 has different read clock and write clock. The conversion module 1 control the output of cached data by using the read clock that is different from the write clock, so that the input clock and the output clock of the conversion module 1 may be in different clock domains, that is, input clock and output clock of the data conversion apparatus 100 may be in different clock domains. Thus, it is possible to overcome data conversion errors caused by clock offsets in both the input clock and the output clock.

In some embodiments, as shown in FIG. 2, the first clock selector 20 further includes a read clock output pin clk_r. The shift register 10 further includes a read clock input pin clk_r. The read clock input pin clk_r of the shift register 10 is electrically connected to the read clock output pin clk_r of the first clock selector 20. The shift register 10 is further configured to control the output rate of the output data of n-bit-width according to the read clock signal clk_r transmitted by the first clock selector 20.

In a case where the bit-width m of the input data is greater than the bit-width n of the output data, the input clock signal clk_i serves as the read clock signal clk_r of the shift register 10. In a case where the bit-width m of the input data is less than the bit-width n of the output data, the output clock signal clk_o serves as the read clock signal clk_r of the shift register 10.

Referring to FIG. 2, the first clock selector 20 receives the input clock signal and the output clock signal transmitted by the frequency divider 30, and selects the corresponding clock signals as the read clock signal and the write clock signal according to the bit-width m of the input data and the bit-width n of the output data, so that the input rate of the input data of the shift register 10 matches the output rate of the output data of the shift register 10, so as to ensure that the data conversion apparatus 100 realizes the conversion of parallel data to serial data or the conversion of serial data to parallel data, and ensure that the input rate of the data and the output rate of the data match. Thus, it is possible to avoid the problem of data transmission errors caused by the mismatch between the data input and output rates.

Figure 3:
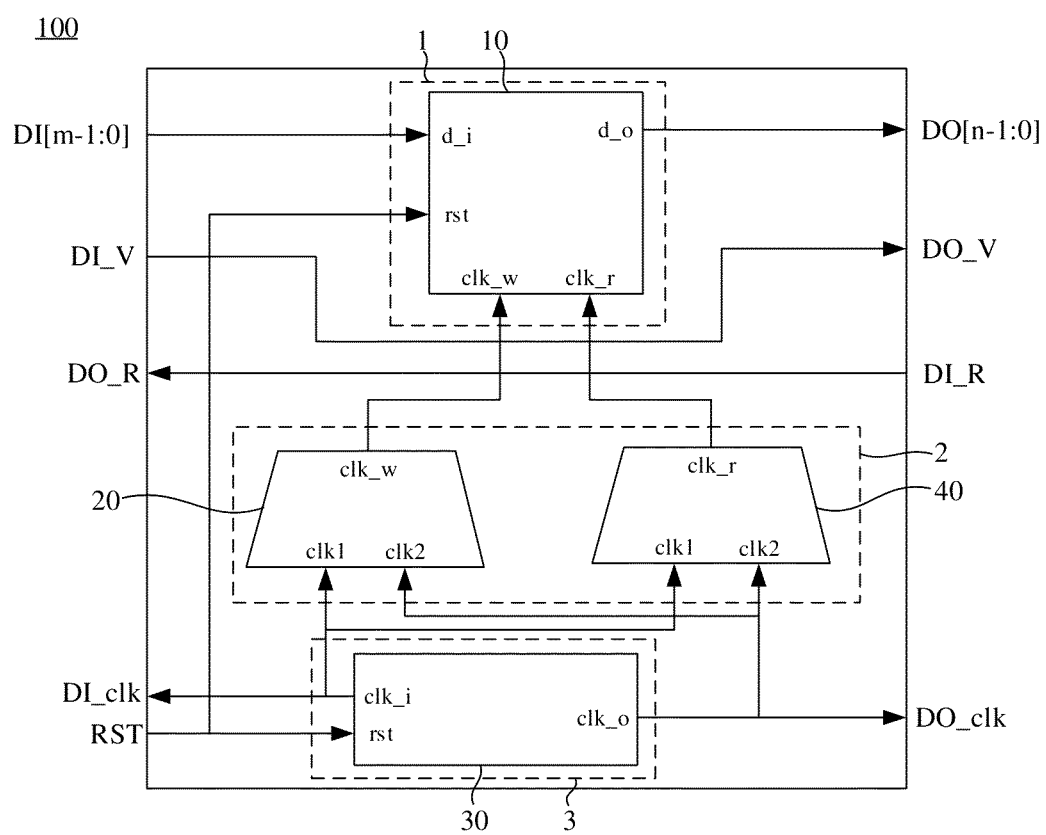
FIG. 3 is a structural diagram of yet another data conversion apparatus, in accordance with some embodiments.

In some embodiments, as shown in FIG. 3, the clock selection module 2 further includes a second clock selector 40. The second clock selector 40 includes a first input pin clk1, a second input pin clk2, and a read clock output pin clk_r.

The first input pin clk1 of the second clock selector 40 is electrically connected to the first pin clk_i of the frequency divider 30, and the second input pin clk2 of the second clock selector 40 is electrically connected to the second pin clk_o of the frequency divider 30, and the read clock output pin clk_r of the second clock selector 40 is electrically connected to the read clock input pin clk_r of the shift register 10. The shift register 10 is configured to control the output rate of the output data of n-bit-width according to the read clock signal clk_r input by the second clock selector 40.

By setting the first clock selector 20, according to the bit-width m of the input data and the bit-width n of the output data, the corresponding clock signal is selected from the input clock signal and the output clock signal as the write clock signal of the shift register 10, and the shift register 10 writes the m-bit input data according to the write clock corresponding to the write clock signal transmitted by the first clock selector 20.

By setting the second clock selector 40, according to the bit-width m of the input data and the bit-width n of the output data, the corresponding clock signal is selected from the input clock signal and the output clock signal as the read clock signal of the shift register 10, and the shift register 10 outputs the n-bit output data according to the write clock corresponding to the write clock signal transmitted by the second clock selector 40.

The first clock selector 20 and the second clock selector 40 select the respective clock signal as the write clock signal or the read clock signal and transmit the respective clock signal to the shift register 10. In this way, compared with a case that a single clock selector selects the corresponding clock signal as the write clock signal or the read clock signal and transmits the clock signal to the shift register 10, the problem of clock signal configuration errors is less likely to occur. Thus, it is possible to ensure that the data writing and reading rates of the shift register 10 (i.e., the input rate of input data, and the output rate of output data) can be maintained at a set value, thereby ensuring the correctness and stability of data transmission of the data conversion apparatus 100 to avoid data transmission errors caused by mismatch in data input and output rates due to clock signal errors.

Figure 4:
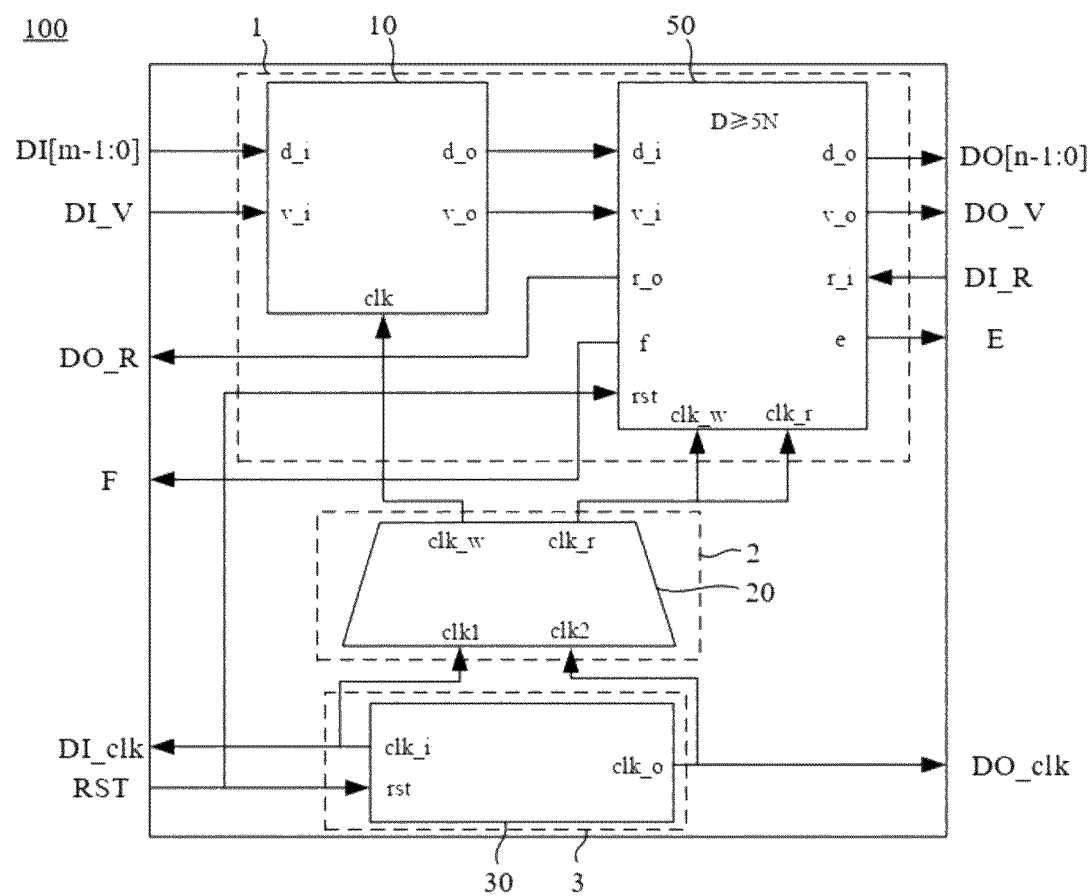
FIG. 4 is a structural diagram of yet another data conversion apparatus, in accordance with some embodiments.

In some embodiments, referring to FIG. 4, the shift register 10 further includes an input data valid pin v_i and an output data valid pin v_o. The conversion module 1 further includes a first-in first-out memory 50. The first-in-first-out memory 50 includes a data input pin d_i, a data output pin d_o, a write clock input pin clk_w, a read clock input pin clk_r, an input ready pin r_i, an output ready pin r_o, an input data valid pin v_i, an output data valid pin v_o and a reset pin rst.

The reset pin rst of the first-in-first-out memory 50 is electrically connected to the reset signal port RST. The first-in-first-out memory 50 is configured to be reset under control of the reset signal port RST.

The data output pin d_o of the shift register 10 is electrically connected to the data input pin d_i of the first-in-first-out memory 50, and the data output pin d_o of the first-in-first-out memory 50 is electrically connected to the data output port DO. The first input port DI_V is electrically connected to the input data valid pin v_i of the shift register 10, the output data valid pin v_o of the shift register 10 is electrically connected to the input data valid pin v_i of the first-in-first-out memory 50, and the output data valid pin v_o of the first-in first-out memory 50 is electrically connected to the first output port DO_V. The second input port DI_R is electrically connected to the input ready pin r_i of the first-in-first-out memory 50, and the output ready pin r_o of the first-in-first-out memory 50 is electrically connected to the second output port DO_R.

In this case, the data conversion process of the data conversion apparatus 100 is as follows.

First, the data conversion apparatus 100 caches the m-bit input data transmitted by the former circuit into the shift register 10, and the m-bit input data is converted into the n-bit output data by the shift register 10. Then, the converted n-bit output data is cached into the first-in-first-out memory 50, and is transmitted to the latter circuit by the first-in-first-out memory 50.

In some embodiments of the present disclosure, the first-in-first-out memory 50 is used to: cache the n-bit output data generated by the shift register 10; and control the output of the cached data by using a read clock different from the write clock.

When the data conversion apparatus 100 converts serial data into parallel data or converts parallel data into serial data, the first-in-first-out memory 50 serves as a data buffer, so that it is possible to simplify the control signal and eliminate delays during data transmission by using the data buffer.

It will be noted that, as shown in FIG. 4, in a case where the conversion module 1 includes a shift register 10 and a first-in first-out memory 50, the data output pin d_o of the shift register 10 is connected to the data input pin d_i of the first-in first-out memory 50, and the shift register 10 converts the m-bit input data into the n-bit output data, and transmits it to the first-in-first-out memory 50 for caching. During this process, a rate at which the shift register 10 outputs the n-bit output data to the first-in-first-out memory 50 is consistent with a rate at which the first-in-first-out memory 50 writes the n-bit output data.

In this case, the read clock of the shift register 10 is the same as the write clock of the first-in-first-out memory 50, and the read clock signal received by the shift register 10 is the same as the write clock signal of the first-in-first-out memory 50. That is, the read clock signal received by the shift register 10 and the write clock signal of the first-in-first-out memory 50 are both the input clock signal or the output clock signal.

In some embodiments, as shown in FIG. 4, the first clock selector 20 further includes a read clock output pin clk_r. The read clock output pin clk_r of the first clock selector 20 is electrically connected to both the write clock input pin clk_w and the read clock input pin clk_r of the first-in-first-out memory 50. The read clock output by the read clock output pin clk_r of the first clock selector 20 serves as the read clock and write clock of the first-in-first-out memory 50.

As shown in FIG. 4, in a case where the clock selection module 2 only includes the first clock selector 20, the first clock selector 20 receives the input clock signal and the output clock signal transmitted by the frequency divider 30, selects the corresponding clock signals according to the bit-width m of the input data and the bit-width n of the output data, and transmits the corresponding clock signals to the shift register 10 and the first-in-first-out memory 50 respectively; the read clock signal of the shift register 10 is same as the write clock signal of the shift register 10, and the read clock signal of the first-in first-out memory 50 is same as the write clock signal of the first-in first-out memory 50.

Figure 5:
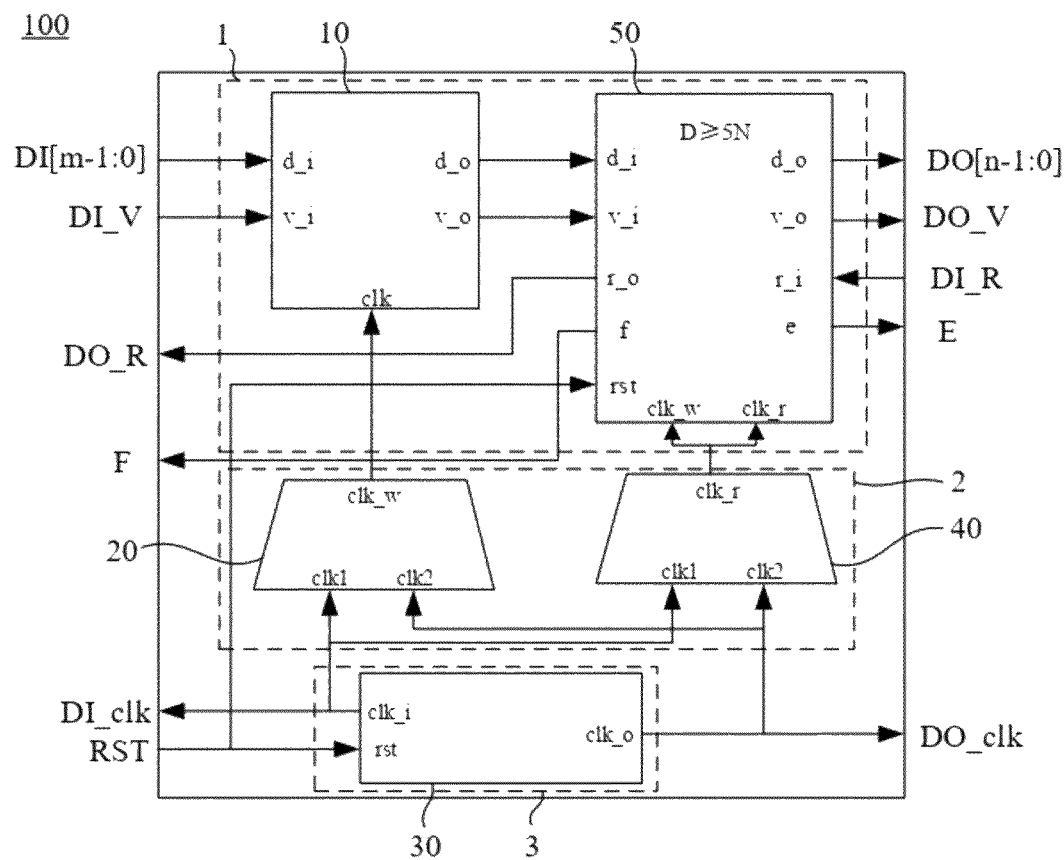
FIG. 5 is a structural diagram of yet another data conversion apparatus, in accordance with some embodiments.

In some embodiments, as shown in FIG. 5, the clock selection module 2 further includes a second clock selector 40. The second clock selector 40 includes a first input pin clk1, a second input pin clk2, and a read clock output pin clk_r. The first input pin clk1 of the second clock selector 40 is electrically connected to the first pin clk_i of the frequency divider 30, and the second input pin clk2 of the second clock selector 40 is electrically connected to the second pin clk_o of the frequency divider 30, and the read clock output pin clk_r of the second clock selector 40 is electrically connected to both the read clock input pin clk_r and the write clock input pin clk_w of the first-in-first-out memory 50.

The second clock selector 40 is configured to: receive the input clock signal clk_i and the output clock signal clk_o transmitted by the frequency divider 30; take the received input clock signal clk_i or the output clock signal clk_o as the read clock signal clk_r according to the bit-width m of the input data and the bit-width n of the output data; and transmit the read clock signal clk_r to both the write clock input pin clk_w and the read clock input pin clk_r of the first-in-first-out memory 50.

The first-in-first-out memory 50 is configured to: control an input rate (i.e., writing rate) of the n-bit output data according to the write clock input by the second clock selector 40; and control an output rate (i.e., reading rate) of the n-bit output data according to the read clock input by the second clock selector 40.

The first-in-first-out memory 50 is provided, and the first-in-first-out memory 50 serves as a data buffer when the data conversion apparatus 100 converts serial data into parallel data or converts parallel data into serial data, so that it is possible to simplify the control signal and eliminate delays during data transmission by using the data buffer.

The first clock selector 20 and the second clock selector 40 select the respective clock signal as the write clock signal or the read clock signal and transmit the respective clock signal to the shift register 10. In this way, compared with a case that a single clock selector selects the corresponding clock signal as the write clock signal or the read clock signal and transmits the clock signal to the shift register 10, the problem of clock signal configuration errors is less likely to occur. Thus, it is possible to ensure that the data writing and reading rates of the shift register 10 (i.e., the input rate of the shift register 10 for the m-bit input data, and the output rate of the shift register 10 for the n-bit output data) may be maintained at the set value, thereby ensuring the correctness and stability of data transmission of the data conversion apparatus to avoid data transmission errors caused by mismatch in data input and output rates due to clock signal errors.

In some embodiments, as shown in FIG. 5, the data conversion apparatus 100 further includes a write feedback port F and a read feedback port E. The first-in-first-out memory 50 further includes a write feedback pin f and a read feedback pin e. The write feedback pin f of the first-in-first-out memory 50 is electrically connected to the write feedback port F, and the read feedback pin e of the first-in-first-out memory 50 is electrically connected to the read feedback port E.

The write feedback port F is configured to control the data input rate (i.e., data writing rate) of the shift register 10 to the first-in-first-out memory 50 according to a write feedback signal transmitted by the write feedback pin f. The read feedback port E is configured to control the data output rate (i.e., data reading rate) of the first-in-first-out memory 50 according to a read feedback signal transmitted by the read feedback pin e.

The state of the write feedback signal includes a first state or a second state. In a case where the state of the write feedback signal is the second state, the shift register 10 is allowed to write data to the first-in first-out memory 50. In a case where the state of the write feedback signal is the first state, the first-in-first-out memory 50 no longer performs data writing.

The state of the read feedback signal includes a first state or a second state. In a case where the state of the read feedback signal is the second state, the data stored in the first-in first-out memory 50 is allowed to read. In a case where the state of the read feedback signal is the first state, the data stored in the first-in first-out memory 50 is not allowed to read.

In some embodiments of the present disclosure, in a case where the state of the write feedback signal is the first state, and the write feedback pin f of the first-in-first-out memory 50 generates a write-full identifier, the data conversion apparatus 100 controls the shift register 10 to suspend the output of n-bit output data, that is, the shift register 10 suspends writing data into the first-in-first-out memory 50. Thus, it is possible to avoid the problem of data overflow and loss caused by continuous data transmission to the first-in-first-out memory 50 when the first-in-first-out memory 50 caches a lot of data due to the fast data input rate and slow data output rate of the first-in-first-out memory 50.

Further, in a case where the state of the write feedback signal is the first state, while suspending the data output of the shift register 10, the data conversion apparatus 100 also identifies data conversion errors of the shift register 10. The data conversion apparatus 100 detects the data transmission state. When detecting a data cache abnormality, the data conversion apparatus 100 resets the first-in-first-out memory 50 through the reset signal port RST.

In some embodiments, as shown in FIG. 5, a storage capacity of the first-in-first-out memory 50 is D, and D≥5N. In a case where the bit-width m of the input data is greater than the bit-width n of the output data, N=m. In a case where the bit-width m of the input data is less than the bit-width n of the output data, N=n.

A stored capacity of the first-in-first-out memory 50 is P. In a case where P is greater than or equal to D−N, the state of the write feedback signal is the first state. In a case where P is less than or equal to N, the state of the read feedback signal is the first state.

Figure 6:
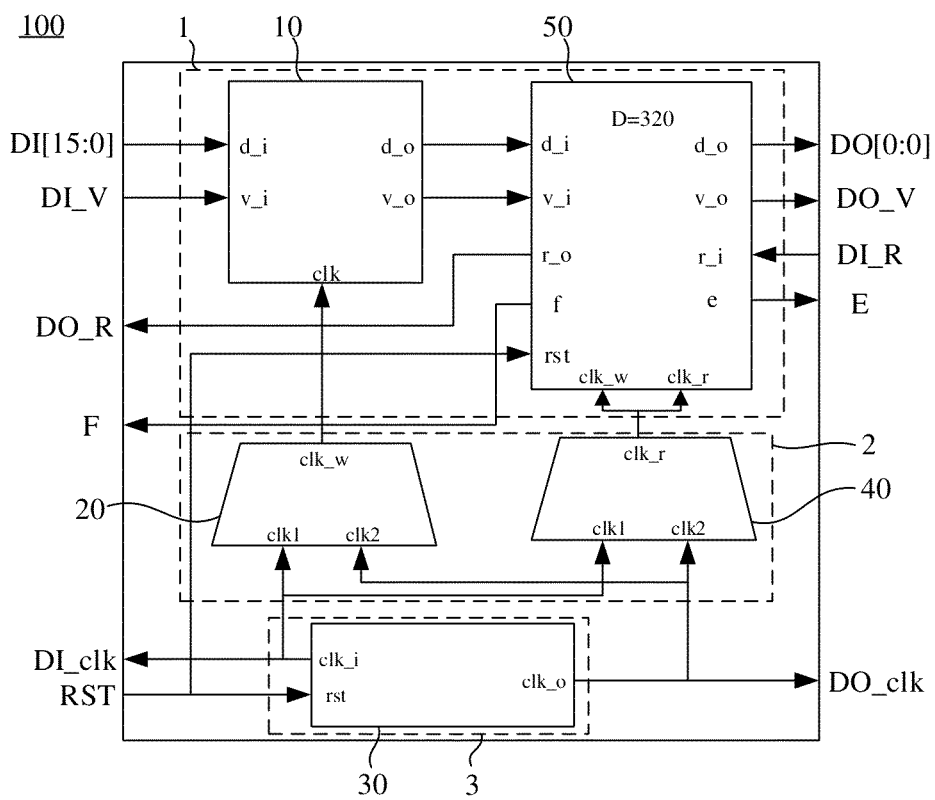
FIG. 6 is a structural diagram of yet another data conversion apparatus, in accordance with some embodiments.

For example, as shown in FIG. 6, the bit-width of the input data is 16, the bit-width of the output data is 1, the bit-width of the input data is greater than the bit-width of the output data, N=16, the storage capacity D of the first-in-first-out memory 50 is greater than or equal to 80 (D≥80), and the stored capacity P of the first-in-first-out memory 50 is greater than or equal to 0 and less than or equal to 64 (0≤P≤64). In a case where the stored capacity P is greater than or equal to 64 (P≥64), the state of the write feedback signal is the first state, the first-in first-out memory is full of cached data, and writing data to the first-in first-out memory is stopped. In a case where the stored capacity P is less than or equal to 16 (P≤16), the state of the read feedback signal is the first state, there is no data cached in the first-in first-out memory, and reading data in the first-in first-out memory is stopped.

Figure 8:
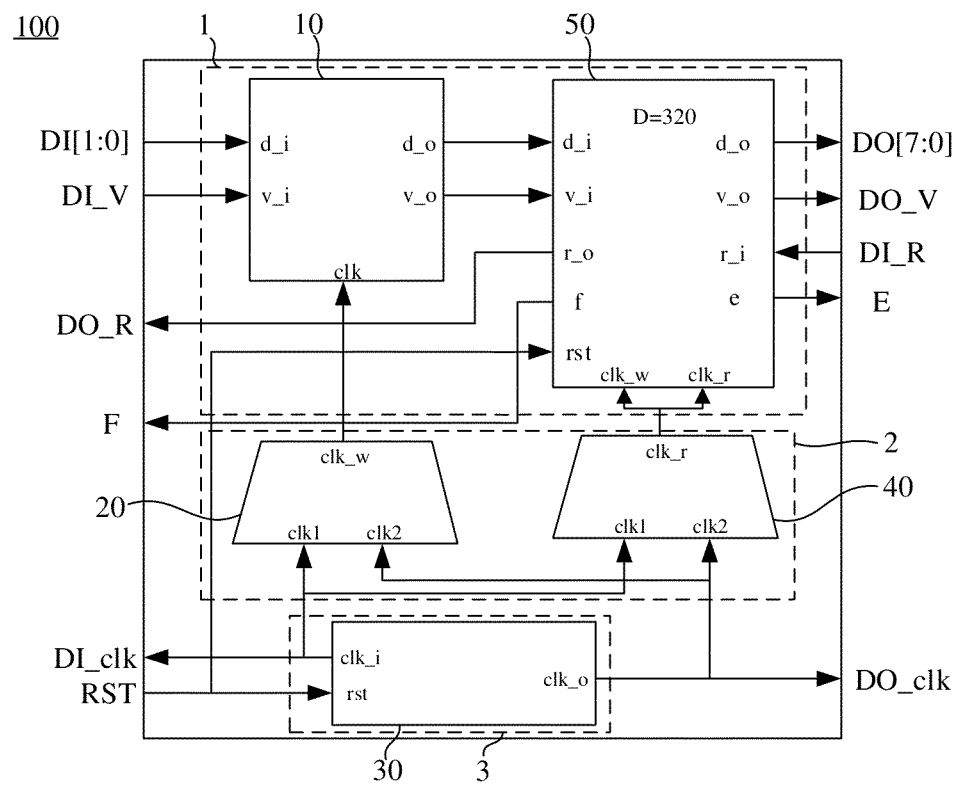
FIG. 8 is a structural diagram of yet another data conversion apparatus, in accordance with some embodiments.

For example, as shown in FIG. 8, the bit-width of the input data is 2, the bit-width of the output data is 8, the bit-width of the input data is less than the bit-width of the output data, N=8, the storage capacity D of the first-in-first-out memory 50 is greater than or equal to 40 (D≥40), and the stored capacity P of the first-in-first-out memory 50 is greater than or equal to 0 and less than or equal to 32 (0≤P≤32). In a case where the stored capacity P is greater than or equal to 32 (P≥32), the state of the write feedback signal is the first state, the first-in first-out memory is full of cached data, and writing data to the first-in first-out memory is stopped. In a case where the stored capacity P is less than or equal to 8 (P≤8), the state of the read feedback signal is the first state, there is no data cached in the first-in first-out memory, and reading data in the first-in first-out memory is stopped.

Figure 7:
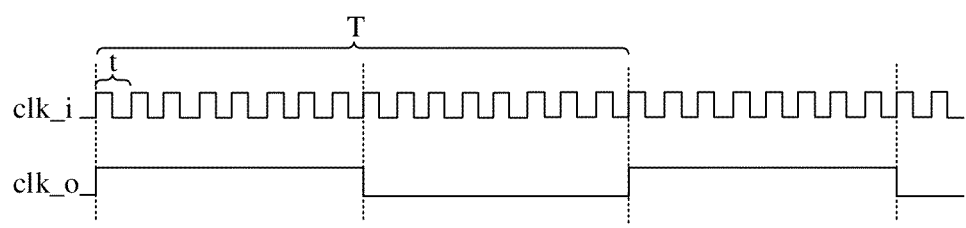
FIG. 7 is a clock timing diagram of the data conversion apparatus in FIG. 6.

In some embodiments, as shown in FIG. 6, the data conversion apparatus 100 is configured to convert input data of 16-bit-width into the output data of 1-bit-width, thereby converting high-bit-width data to low-bit-width data. FIG. 7 is a clock timing diagram of the input clock and the output clock corresponding to the input clock signal and the output clock signal output by the frequency divider 30.

As shown in FIGS. 6 and 7, a period of the input clock signal clk_i is t, and a frequency of the input clock signal clk_i is $$f_{clk\_i} = f_r = \frac{1}{t};$$

a period of the output clock signal clk_o is T, and a frequency of the output clock signal clk_o is $$f_{clk\_o} = f_w = \frac{1}{T}.$$

A bit width conversion ratio of the input data and the output data is $$R = \frac{f_{clk\_i}}{f_{clk\_o}} = 16.$$

The first clock selector 20 selects the output clock as the write clock of the shift register 10, and the second clock selector 40 selects the input clock as the read clock and write clock of the first-in-first-out memory 50. It will be understood that the output rate of the data conversion apparatus 100 for the n-bit output data is the same as the output rate of the first-in-first-out memory 50 for n-bit output data.

The storage capacity of the first-in-first-out memory 50 is, for example, 320 bits. In a case where the storage capacity reaches 304 bits, the state of the write feedback signal is the first state, the first-in first-out memory is full of cached data, and writing data to the first-in first-out memory is stopped. In a case where the storage capacity reaches 16 bits, the state of the read feedback signal is the first state, there is no data cached in the first-in first-out memory, and reading data from the first-in first-out memory is stopped.

It will be noted that the storage capacity of the first-in-first-out memory 50 may be set according to actual requirements, which is only used as an example of a possible implementation and is not intended to limit the present disclosure.

Figure 9:
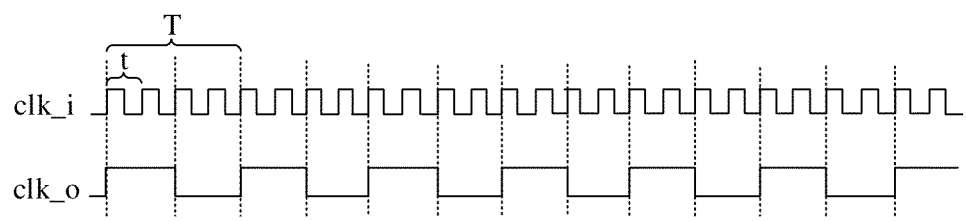
FIG. 9 is a clock timing diagram of the data conversion apparatus in FIG. 8.

In some embodiments, as shown in FIG. 8, the data conversion apparatus 100 is configured to convert input data of 2-bit-width into the output data of 8-bit-width, thereby converting high-bit-width data to low-bit-width data. FIG. 9 is a clock timing diagram of the input clock and the output clock corresponding to the input clock signal and the output clock signal output by the frequency divider 30.

As shown in FIGS. 8 and 9, the period of the input clock signal clk_i is t, and the frequency of the input clock signal clk_i is $$f_{clk\_i} = f_w = \frac{1}{t};$$

the period of the output clock signal clk_o is T, and the frequency of the output clock signal clk_o is $$f_{clk\_o} = f_r = \frac{1}{T}.$$

A bit width conversion ratio of the input data and the output data is $$R = \frac{f_{clk\_i}}{f_{clk\_o}} = 4.$$

The first clock selector 20 selects the output clock as the write clock of the shift register 10, and the second clock selector 40 selects the input clock as the read clock and write clock of the first-in-first-out memory 50. It will be understood that the output rate of the data conversion apparatus 100 for the n-bit output data is the same as the output rate of the first-in-first-out memory 50 for n-bit output data.

The storage capacity of the first-in-first-out memory 50 is, for example, 320 bits. In a case where the storage capacity reaches 312 bits, the state of the write feedback signal is the first state, the first-in first-out memory is full of cached data, and writing data to the first-in first-out memory is stopped. In a case where the storage capacity reaches 8 bits, the state of the read feedback signal is the first state, there is no data cached in the first-in first-out memory, and reading data from the first-in first-out memory is stopped.

It will be noted that the storage capacity of the first-in-first-out memory 50 may be set according to actual requirements, which is only used as an example of a possible implementation and is not intended to limit the present disclosure.

The data conversion method provided in some embodiments of the present disclosure will be described below.

Figure 10:
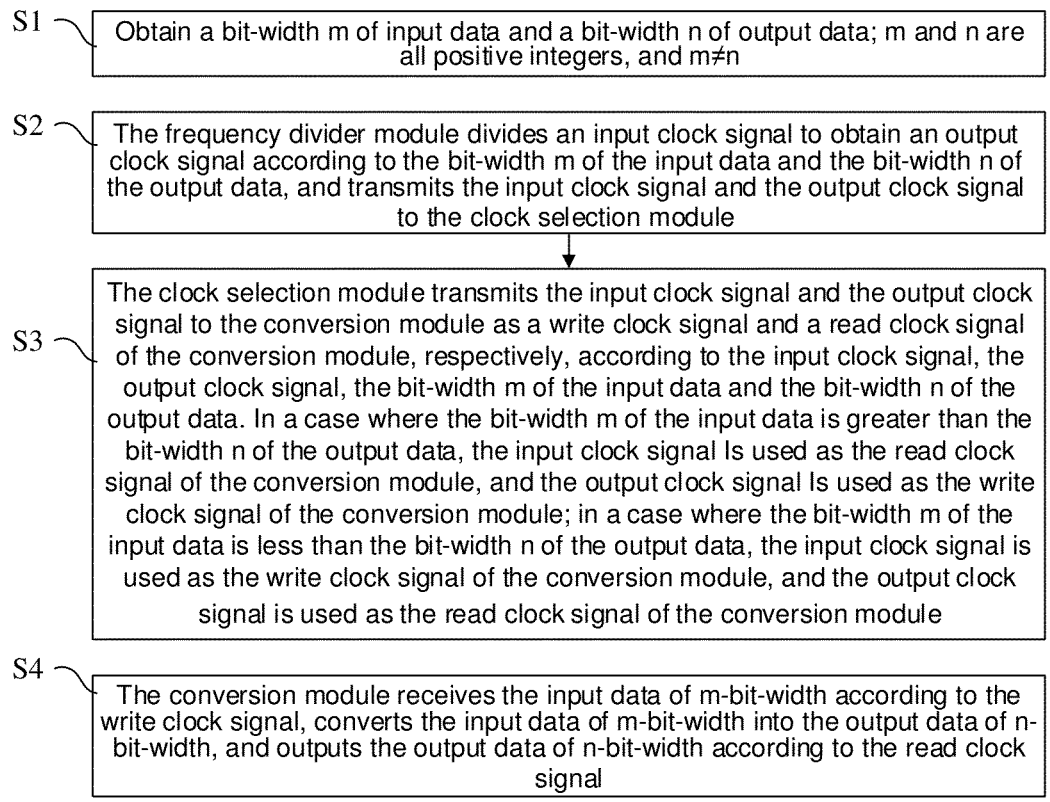
FIG. 10 is a flow diagram of a data transmission method, in accordance with some embodiments.

In some embodiments, as shown in FIG. 10, the data transmission method includes steps S1 to S4.

In S1, a bit-width m of input data and a bit-width n of output data are obtained. m and n are all positive integers, and m≠n.

In S2, the frequency divider module divides an input clock signal to obtain an output clock signal according to the bit-width m of the input data and the bit-width n of the output data, and transmits the input clock signal and the output clock signal to the clock selection module.

In S3, according to the input clock signal, the output clock signal, the bit-width m of the input data and the bit-width n of the output data, the clock selection module transmits the input clock signal and the output clock signal to the conversion module as a write clock signal and a read clock signal of the conversion module respectively.

In a case where the bit-width m of the input data is greater than the bit-width n of the output data, the input clock signal is used as the read clock signal of the conversion module, and the output clock signal is used as the write clock signal of the conversion module.

In a case where the bit-width m of the input data is less than the bit-width n of the output data, the input clock signal is used as the write clock signal of the conversion module, and the output clock signal is used as the read clock signal of the conversion module.

In S4, the conversion module receives the input data of m-bit-width according to the write clock signal, converts the input data of m-bit-width into the output data of n-bit-width, and outputs the output data of n-bit-width according to the read clock signal.

For example, a frequency of the input clock signal clk_i is $f_{clk\_i}$, a frequency of the output clock signal clk_o is $f_{clk\_o}$, a frequency of the write clock signal clk_w is $f_w$, and a frequency of the read clock signal clk_r is $f_r$. There is a relationship between a bit width conversion ratio R of the input data and the output data and the bit-width m of the input data, the bit-width n of the output data, the frequency $f_{clk\_i}$ of the input clock signal clk_i, the frequency $f_{clk\_o}$ of the output clock signal clk_o, the frequency $f_w$ of the write clock signal clk_w and the frequency $f_r$ of the read clock signal clk_r.

In the case where the bit-width m of the input data is greater than the bit-width n of the output data, the input clock signal clk_i is used as the read clock signal clk_r of the conversion module 1, and the output clock signal clk_o is used as the write clock signal clk_w of the conversion module 1, $$R = \frac{m}{n} = \frac{f_{clk\_i}}{f_{clk\_o}} = \frac{f_r}{f_w}.$$

In the case where the bit-width m of the input data is less than the bit-width n of the output data, the input clock signal clk_i is used as the write clock signal clk_w of the conversion module 1, and the output clock signal clk_o is used as the read clock signal clk_r of the conversion module 1, $$R = \frac{n}{m} = \frac{f_{clk\_i}}{f_{clk\_o}} = \frac{f_w}{f_r}.$$

The data conversion method provided by some embodiments of the present disclosure may be applied to the data conversion apparatus 100 provided in any of the above embodiments, which is able to perform different execution programs (data serial/parallel conversion execution programs or data parallel/serial conversion execution programs) according to requirements, thereby achieving the conversion of bit-width of data, such as the conversion of serial data into parallel data or the conversion of parallel data into serial data. Compared with a conversion manner of the fixed-bit-width, the bit-width of the input data and the bit-width of the output data may be flexibly set, so that the usage is flexible, and there are more application scenarios.

Referring to FIGS. 1 to 5, when performing the execution programs, a control signal is first sent to the conversion module 1 according to the bit-width m of the input data and the bit-width n of the output data, and then, the conversion module 1 converts serial data into parallel data or converts parallel data into serial data according to the received control signal. It is possible to achieve the conversion of serial data into parallel data or achieve the conversion of parallel data to serial data through an apparatus, thereby achieving the conversion of the data format of data (e.g., the conversion of parallel data into serial data, or the conversion of serial data into parallel data) in the former circuit, and achieving the transmission of the converted data to the latter circuit.

The frequency divider module 3 divides the input clock according to the bit-width m of the input data and the bit-width n of the output data to obtain the output clock, and transmits both the input clock and the output clock that is obtained after dividing the input clock to the clock selection module 2. Thus, the obtained output clock and the input clock are in-phase clocks, which may ensure the integrity and correctness of data under high-speed continuous data transmission, so as to avoid data transmission errors due to the asynchronous input clock and output clock.

In the case where the bit-width m of the input data is greater than the bit-width n of the output data, it is necessary to convert parallel data to serial data through the data conversion method; the input clock signal clk_i is used as the read clock signal clk_r of the conversion module 1, and the output clock signal clk_o is used as the write clock signal clk_w of conversion module 1. In this case, a period of the write clock of the conversion module 1 is greater than a period of the read clock, and a rate at which the conversion module 1 writes the input data is less than a rate at which the conversion module 1 reads the output data.

In the case where the bit-width m of the input data is less than the bit-width n of the output data, it is necessary to convert serial data to parallel data through the data conversion method; the input clock signal clk_i is used as the write clock signal clk_w of the conversion module 1, and the output clock signal clk_o is used as the read clock signal clk_r of the conversion module 1. In this case, the period of the write clock of the conversion module 1 is less than the period of the read clock of the conversion module 1, and the rate at which the conversion module 1 writes the input data is greater than the rate at which the conversion module 1 reads the output data.

In conclusion, the clock selection module 2 transmits the different write clock signal clk_w and read clock signal clk_r to the conversion module 1 according to the bit-width m of the input data and the bit-width n of the output data, so that the clock of the data conversion apparatus 100 is adjustable; moreover, the conversion module 1 has different write clock and read clock, i.e., the data conversion apparatus 100 has different write clock and read clock, so that the data conversion apparatus 100 matches the data transmission rate that adapts thereto according to the bit-width of data, so as to ensure the data conversion and the data transmission rate of the data conversion apparatus 100.

The electronic device 1000 provided in some embodiments of the present disclosure will be described below.

Figure 11:
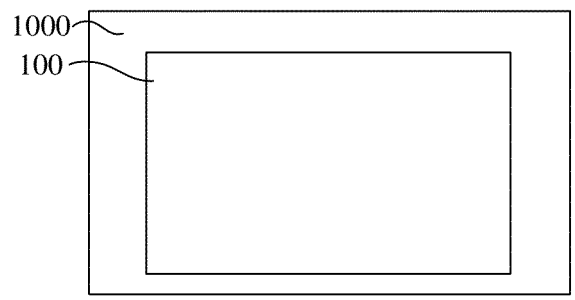
FIG. 11 is a structural diagram of an electronic device, in accordance with some embodiments.

Some embodiments of the present disclosure provide an electronic device 1000. As shown in FIG. 11, the electronic device includes a data conversion apparatus 100. The data conversion apparatus 100 is, for example, the data conversion apparatus 100 provided according to any of the above embodiments.

In some embodiments, the data conversion apparatus 100 is applied to the data conversion method provided in the above embodiments.

Beneficial effects of the electronic device are the same as the beneficial effects of the data conversion apparatus 100 described in some of the above embodiments, which will not be described herein again.

The data conversion apparatus 100 provided by some embodiments of the present disclosure, as a data bit width conversion device, converts data of high-bit-width into data of low-bit-width (the bit-width m of the input data is greater than the bit-width n of the output data, for example, parallel data is converted into serial data), or a device that converts low-bit-width data into high-bit-width data (the bit-width m of the input data is smaller than the bit-width n of the output data, such as converting serial data to parallel data), which is suitable for digital circuits that need to perform Bit-width conversion of data signals, such as serial/parallel conversion or parallel/serial conversion scenarios of data signals.

It will be noted that in the data conversion apparatus 100 provided by some embodiments of the present disclosure, the bit-width m of the input data and the bit-width n of the output data may be set as needed, thereby achieving the conversion of high-bit-width data to low-bit-width data or the conversion of low-bit-width data to high-bit-width data. Referring to FIG. 8, the data conversion apparatus 100 converts the input data of 2-bit-width into the output data of 8-bit-width, thereby achieving the conversion of low-bit-width data to high-bit-width data. It will be understood that in some examples, it may also be regarded as achieving the conversion of serial data to parallel data.

In some embodiments of the present disclosure, the data conversion apparatus 100 is applied to the electronic device 1000 as a device for serial/parallel conversion of data signals or parallel/serial conversion, which is intended only as an illustration of a possible implementation and is not intended to limit the specific application of the data conversion apparatus 100 in the present disclosure.

The above are only specific embodiments of the present disclosure, but the scope of protection of the present disclosure is not limited thereto, and any person skilled in the art may conceive of variations or replacements within the technical scope of the present disclosure, which shall fall within the protection scope of the present disclosure. Therefore, the protection scope of the present disclosure should be determined by the protection scope of the claims.

What is claimed is:

1. A data conversion apparatus, comprising: a frequency divider module, a clock selection module, and a conversion module; wherein
the frequency divider module is electrically connected to the conversion module, and configured to: divide an input clock signal to obtain an output clock signal according to a bit-width m of input data and a bit-width n of output data; and transmit the input clock signal and the output clock signal to the clock selection module;
the clock selection module is electrically connected to both the conversion module and the frequency divider module, and configured to transmit the input clock signal and the output clock signal to the conversion module as a write clock signal and a read clock signal of the conversion module, respectively, according to the input clock signal, the output clock signal, the bit-width m of the input data and the bit-width n of the output data;
the conversion module is configured to receive the input data of m-bit-width according to the write clock signal; and
the conversion module is further configured to: convert the input data into the output data of n-bit-width; and output the output data according to the read clock signal; wherein m and n are positive integers, and m≠n;
wherein in a case where the bit-width m of the input data is greater than the bit-width n of the output data, the input clock signal is used as the read clock signal of the conversion module, and the output clock signal is used as the write clock signal of the conversion module; and
in a case where the bit-width m of the input data is less than the bit-width n of the output data, the input clock signal is used as the write clock signal of the conversion module, and the output clock signal is used as the read clock signal of the conversion module.

2. The data conversion apparatus according to claim 1, wherein the data conversion apparatus further comprises:
a data transmission port electrically connected to the conversion module, the data transmission port including a data input port and a data output port; wherein the data input port is configured to receive the input data of m-bit-width, and the data output port is configured to output the output data of n-bit-width;
a clock signal port electrically connected to the frequency divider module, the clock signal port including a clock signal input port and a clock signal output port; wherein the clock signal input port is electrically connected to an input clock port of the frequency divider module, and the clock signal output port is electrically connected to an output clock port of the frequency divider module; and
a reset signal port electrically connected to both the frequency divider module and the conversion module; wherein the frequency divider module is further configured to reset the input clock signal and the output clock signal under control of the reset signal port, and the conversion module is further configured to be reset under the control of the reset signal port.

3. The data conversion apparatus according to claim 2, wherein the data conversion apparatus further comprises:
a first signal port including a first input port and a first output port; wherein the first input port is configured to receive a first input signal, and the first output port is configured to output a first output signal; states of the first input signal and the first output signal each include a first state or a second state; and
a second signal port including a second input port and a second output port; wherein the second input port is configured to receive a second input signal, and the second output port is configured to output a second output signal; states of the second input signal and the second output signal each include a first state or a second state.

4. The data conversion apparatus according to claim 3, wherein in a case where the states of the first input signal received by the first input port and the second input signal received by the second input port are both the first state, the data input port is configured to receives the input data of m-bit-width;
in a case where the states of the first input signal received by the first input port and the second input signal received by the second input port are both the second state, or in a case where the state of any one of the first input signal received by the first input port and the second input signal received by the second input port is the first state, and the state of another of the first input signal received by the first input port and the second input signal received by the second input port is the second state, the data input port is configured to receive no input data of m-bit-width;
in a case where the states of the first output signal output by the first output port and the second output signal output by the second output port are both the first state, the data output port is configured to output the output data of n-bit-width; and
in a case where the states of the first output signal output by the first output port and the second output signal output by the second output port are both the second state, or in a case where the state of any one of the first output signal output by the first output port and the second output signal output by the second output port is the first state, and the state of another of the first output signal output by the first output port and the second output signal output by the second output port is the second state, the data output port is configured to output no output data of n-bit-width.

5. The data conversion apparatus according to claim 2, wherein
the frequency divider module includes a frequency divider; the frequency divider includes a first pin, a second pin and a reset pin; the first pin of the frequency divider is electrically connected to the clock signal input port, the second pin of the frequency divider is electrically connected to the clock signal output port, and the reset pin of the frequency divider is electrically connected to the reset signal port;

the frequency divider is configured to divide the input clock signal to obtain the output clock signal according to the bit-width m of the input data and the bit-width n of the output data; and the frequency divider is further configured to reset the input clock signal and the output clock signal under the control of the reset signal port.

6. The data conversion apparatus according to claim 5, wherein the conversion module includes a shift register; the shift register is configured to convert the received input data of m-bit-width into the output data of n-bit-width;

the clock selection module includes a first clock selector; the first clock selector includes a first input pin, a second input pin and a write clock output pin;

the first input pin of the first clock selector is electrically connected to the first pin of the frequency divider, and the second input pin of the first clock selector is electrically connected to the second pin of the frequency divider; and the first clock selector is configured to: receive the input clock signal and the output clock signal transmitted by the frequency divider; and transmit the received input clock signal or output clock signal to the shift register as a write clock signal according to the bit-width m of the input data and the bit-width n of the output data.

7. The data conversion apparatus according to claim 6, wherein the shift register includes a data input pin, a data output pin and a write clock input pin;

in a case where the bit-width m of the input data is greater than the bit-width n of the output data, the output clock signal is used as a write clock signal of the shift register;

in a case where the bit-width m of the input data is less than the bit-width n of the output data, the input clock signal is used as the write clock signal of the shift register;

the data input pin of the shift register is electrically connected to the data input port, the data output pin of the shift register is electrically connected to the data output port, and the write clock pin of the shift register is electrically connected to the write clock output pin of the first clock selector; and the shift register is configured to control an input rate of the input data according to the write clock signal transmitted by the first clock selector.

8. The data transmission apparatus according to claim 7, wherein the first clock selector further includes a read clock output pin; the first clock selector is further configured to transmit the received input clock signal or output clock signal to the shift register as a read clock signal according to the bit-width m of the input data and the bit-width n of the output data;

the shift register further includes a read clock input pin;

the read clock input pin of the shift register is electrically connected to the read clock output pin of the first clock selector; and the shift register is further configured to control an output rate of the output data according to the read clock signal transmitted by the first clock selector; wherein in a case where the bit-width m of the input data is greater than the bit-width n of the output data, the input clock signal is used as a read clock signal of the shift register; and in a case where the bit-width m of the input data is less than the bit-width n of the output data, the output clock signal is used as the read clock signal of the shift register.

9. The data transmission apparatus according to claim 7, wherein the clock selection module further includes a second clock selector; the second clock selector includes a first input pin, a second input pin and a read clock output pin;

the first input pin of the second clock selector is electrically connected to the first pin of the frequency divider, the second input pin of the second clock selector is electrically connected to the second pin of the frequency divider, and the read clock output pin of the second clock selector is electrically connected to the read clock input pin of the shift register; and the second clock selector is configured to: receive the input clock signal and the output clock signal transmitted by the frequency divider; and transmit the received input clock signal or the output clock signal to the shift register as a read clock signal according to the bit-width m of the input data and the bit-width n of the output data;

the shift register is configured to control an output rate of the output data according to the read clock signal input by the second clock selector.

10. The data conversion apparatus according to claim 6, wherein the conversion module further includes a first-in first-out memory;

the first-in-first-out memory includes a data input pin, a data output pin, a write clock input pin, a read clock input pin, an input ready pin, an output ready pin, an input data valid pin, an output data valid pin and a reset pin;

the reset pin of the first-in-first-out memory is electrically connected to the reset signal port; the first-in-first-out memory is configured to be reset under the control of the reset signal port; and the data conversion apparatus further comprises a second signal port including a second input port and a second output port; wherein the second input port is electrically connected to the input ready pin of the first-in-first-out memory, and the output ready pin of the first-in-first-out memory is electrically connected to the second output port.

11. The data conversion apparatus according to claim 10, wherein the data conversion apparatus further comprises a first signal port including a first input port and a first output port; wherein the shift register further includes an input data valid pin and an output data valid pin;

the data output pin of the shift register is electrically connected to the data input pin of the first-in-first-out memory, and the data output pin of the first-in-first-out memory is electrically connected to the data output port; and the first input port is electrically connected to the input data valid pin of the shift register, the output data valid pin of the shift register is electrically connected to the input data valid pin of the first-in-first-out memory, and the output data valid pin of the first-in first-out memory is electrically connected to the first output port.

12. The data transmission apparatus according to claim 11, wherein the first clock selector further includes a read clock output pin;

the read clock output pin of the first clock selector is electrically connected to both the write clock input pin and the read clock input pin of the first-in-first-out memory; and a read clock output by the read clock output pin of the first clock selector is used as a read clock and a write clock of the first-in-first-out memory.

13. The data transmission apparatus according to claim 11, wherein the clock selection module further includes a second clock selector; the second clock selector includes a first input pin, a second input pin and a read clock output pin;

the first input pin of the second clock selector is electrically connected to the first pin of the frequency divider, and the second input pin of the second clock selector is electrically connected to the second pin of the frequency divider, and the read clock output pin of the second clock selector is electrically connected to both the read clock input pin and the write clock input pin of the first-in-first-out memory; and the second clock selector is configured to: receive the input clock signal and the output clock signal transmitted by the frequency divider; take the received input clock signal or the output clock signal as a read clock signal according to the bit-width m of the input data and the bit-width n of the output data; and transmit the read clock signal to both the write clock input pin and the read clock input pin of the first-in-first-out memory.

14. The data conversion apparatus according to claim 13, wherein the first-in-first-out memory is configured to: control a writing rate of the output data according to a write clock input by the second clock selector; and control a reading rate of the output data according to a read clock input by the second clock selector.

15. The data conversion apparatus according to claim 10, wherein the data conversion apparatus further comprises a write feedback port and a read feedback port;

the first-in-first-out memory further includes a write feedback pin and a read feedback pin;

the write feedback pin of the first-in-first-out memory is electrically connected to the write feedback port, and the read feedback pin of the first-in-first-out memory is electrically connected to the read feedback port;

the write feedback port is configured to control a data writing rate of the shift register to the first-in-first-out memory according to a write feedback signal transmitted by the write feedback pin; and the read feedback port is configured to control a data reading rate of the first-in-first-out memory according to a read feedback signal transmitted by the read feedback pin.

16. The data conversion apparatus according to claim 10, wherein a storage capacity of the first-in-first-out memory is D, and D≥5N;

wherein in a case where the bit-width m of the input data is greater than the bit-width n of the output data, N=m; in a case where the bit-width m of the input data is less than the bit-width n of the output data, N=n.

17. The data transmission apparatus according to claim 16, wherein a state of the write feedback signal includes a first state or a second state; in a case where the state of the write feedback signal is the second state, the write feedback port is configured to control the shift register to write data to the first-in-first-out memory; in a case where the state of the write feedback signal is the first state, the write feedback port is configured to control the shift register to suspend writing data to the first-in-first-out memory; and a state of the read feedback signal includes a first state or a second state; in a case where the state of the read feedback signal is the second state, the read feedback port is configured to control data stored in the first-in-first-out memory to be read; in a case where the state of the read feedback signal is the first state, the read feedback port is configured to control the data stored in the first-in-first-out memory to not be read.

18. The data conversion apparatus according to claim 17, wherein a stored capacity of the first-in-first-out memory is P;

in a case where P is greater than or equal to D-N, the state of the write feedback signal is the first state; and in a case where P is less than or equal to N, the state of the read feedback signal is the first state.

19. An electric device, comprising the data conversion apparatus according to claim 1.

20. A data transmission method applied to the data conversion apparatus according to claim 1, the data transmission method comprising:

obtain the bit-width m of the input data and the bit-width n of the output data; wherein m and n are positive integers, and m≠n;

divide, by the frequency divider module, the input clock signal to obtain the output clock signal according to the bit-width m of the input data and the bit-width n of the output data; and transmit, by the frequency divider module, the data-input clock signal and the output clock signal to the clock selection module;

transmit, by the clock selection module, the input clock signal and the output clock to the conversion module as the write clock signal and/or the read clock signal of the conversion module, respectively, according to the input clock signal, the output clock signal, the bit-width m of the input data and the bit-width n of the output data; wherein in a case where the bit-width m of the input data is greater than the bit-width n of the output data, the input clock signal is used as the read clock signal of the conversion module, and the output clock signal is used as the write clock signal of the conversion module; and in a case where the bit-width m of the input data is less than the bit-width n of the output data, the input clock signal is used as the write clock signal of the conversion module, and the output clock signal is used as the read clock signal of the conversion module; and receive, by the conversion module, the input data of m-bit-width according to the write clock signal; convert, by the conversion module, the input data of m-bit-width into the output data of n-bit-width; and output, by the conversion module, the output data of n-bit-width according to the read clock signal.

\* \* \* \* \*